(12) United States Patent
Charlet et al.

(10) Patent No.: US 8,099,699 B2
(45) Date of Patent: Jan. 17, 2012

(54) FILTERING OF SMALL VALUES FOR THE VERIFICATION OF INTEGRATED CIRCUITS

(75) Inventors: François Charlet, Grenoble (FR); Mathias Silvant, Voiron (FR)

(73) Assignee: Edxact, Voiron (FR)

( * ) Notice: Subject to any disclaimer, the term of this patent is extended or adjusted under 35 U.S.C. 154(b) by 336 days.

(21) Appl. No.: 12/477,846

(22) Filed: Jun. 3, 2009

(65) Prior Publication Data

US 2010/0036516 A1  Feb. 11, 2010

(30) Foreign Application Priority Data

Jun. 3, 2008 (FR) ..................... 08 53661

(51) Int. Cl.
*G06F 9/455* (2006.01)
*G06F 17/50* (2006.01)

(52) U.S. Cl. ........... 716/111; 716/106; 716/108; 716/51

(58) Field of Classification Search ............... 716/51, 716/106, 111
See application file for complete search history.

(56) References Cited

U.S. PATENT DOCUMENTS

| | | | |
|---|---|---|---|
| 5,568,558 A * | 10/1996 | Ramm et al. | 381/94.4 |
| 6,871,334 B2 | 3/2005 | Mabuchi et al. | |
| 7,277,804 B2 | 10/2007 | Gebbie et al. | |
| 7,315,212 B2 | 1/2008 | Floyd et al. | |
| 2001/0029601 A1 * | 10/2001 | Kimura et al. | 716/19 |
| 2005/0288914 A1 | 12/2005 | Gebbie et al. | |
| 2006/0004551 A1 | 1/2006 | Freund | |
| 2006/0031055 A1 | 2/2006 | Sheehan | |
| 2007/0005325 A1 | 1/2007 | Gong et al. | |
| 2007/0299647 A1 * | 12/2007 | Bolcato et al. | 703/14 |
| 2008/0133201 A1 * | 6/2008 | Guedon | 703/14 |
| 2009/0172613 A1 * | 7/2009 | Suaya et al. | 716/4 |
| 2010/0004886 A1 * | 1/2010 | Charlet et al. | 702/65 |

FOREIGN PATENT DOCUMENTS

WO  2007/051838 A1  5/2007

OTHER PUBLICATIONS

Chen, Wai-Kai, "The circuits and filters handbook", CRC Press, XP002523235, pp. 1271-1273 (2003).
De Berg, M. et al., "Computational Geometry: Algorithms and applications", Springer-Verlag, pp. 183-211 (1997).

(Continued)

*Primary Examiner* — Vuthe Siek
*Assistant Examiner* — Brian Ngo
(74) *Attorney, Agent, or Firm* — Nixon Peabody LLP (57) ABSTRACT

The invention relates to a method of simulating an electronic circuit, represented in the form of masks and connections, comprising:
a) the definition of the circuit in the form of a first list (140) of electrical components and their interconnections,
b) the separation of the data of this first list into a first sub-assembly (170) of components to be modified by a filtering step, and into a second sub-assembly (160) of components not to be modified by this filtering step,
c) the filtering of the data of the first sub-assembly (170) of components,
d) the definition of the circuit in the form of a second list (190) of electrical components and their interconnections, from the data of the second sub-assembly (160) and the data resulting from step c),
e) the simulation (195) of the circuit by means of this second list,
f) if the result of the simulation is satisfactory, the manufacture of the circuit.

15 Claims, 5 Drawing Sheets

OTHER PUBLICATIONS

Horowitz, Mark et al., "Resistance Extraction from Mask Layout Data", IEEE Transactions on CAD, CAD-2(3): pp. 145-150 (Jul. 1983).

Kanapka, Joe et al., "Fast Methods for Extraction and Sparsification of Substrate Coupling", in 37th Design Automation Conference, pp. 738-743 (2000).

Kapur, Sharad et al., "Large-Scale Capacitance Calculation", in 37th Design Automation Conference, pp. 744-749 (2000).

Kerns, Kevin J. et al., "Preservation of Passivity During RLC Network Reduction via Split Congruence Transformations", Dept. Electrical Engineering, University of Washington, pp. 34-39 (1997).

Kerns, Kevin J. et al., "Stable and Efficient Reduction of Large, Multiport RC Networks by Pole Analysis via Congruence Transformations", IEEE Transactions on Computer-Aided Design of Integrated Circuits and Systems, 16(7), pp. 734-744 (Jul. 1997).

Krauter, Byron et al., "Layout Based Frequency Dependent Inductance and Resistance Extraction for On-Chip Interconnect Timing Analysis", in 35th Design Automation Conference, pp. 303-308 (1998).

Lai, Glenn G. et al., "Hinted Quad Trees for VLSI Geometry DRC Based on Efficient Searching for Neighbors", IEEE Transactions on Computer-Aided Design, 15(3): 317-324 (Mar. 1996).

Lehoucq, R.B. et al., "Deflation Techniques for an Implicitly Restarted Arnoldi Iteration", SIAM Journal on Matrix Analysis and Applications, vol. 17, pp. 789-821 (Oct. 1996).

Odabasioglu, Altan et al., "Practical Considertions for Passive Reduction of RLC Circuits", IEEE, pp. 214-219 (1999).

Odabasioglu, Altan et al., PRIMA: Passive Reduced-Order Interconnect Macromodeling Algorithm, IEEE, pp. 58-65 (1997).

Pong, Teng-Sin et al., "A Parasitics Extraction and Network Reduction Algorithm for Analog VLSI", IEEE Transactions on Computer-Aided Design, vol. 10(2), pp. 145-149 (Feb. 1991).

Radke, Richard J., "A Matlab Implementation of the Implicitly Restarted Arnoldi Method for Solving Large-Scale Eigenvalue Problems", Dept. of Computational and Applied Math, Rice University, Houston, Texas, pp. 1-94 (Apr. 1996).

Sorensen, D.C., "Implicit Application of Polynomial Filters in a K-Step Arnoldi Method", SIAM J. Matrix Anal. Appl., vol. 13(1), pp. 357-385 (Jan. 1992).

van der Meijs, N.P. et al., "An Efficient Finite Element Method for Submicron IC Capacitance Extraction", 26th ACM/ IEEE Design Automation Conference, 5 pgs. (1989).

Vanoostende, Paul et al., "DARSI: RC Data Reduction", IEEE Transactions on Computer-Aided Design of Integrated Circuits and Sysems, No. 4, New York, pp. 493-500 (Apr. 1991).

International Search Report dated Feb. 2, 2007, PCT/EP2006/068074.

French Preliminary Search Report dated Jul. 8, 2006, FR 0553354.

French Preliminary Search Report dated Jan. 5, 2009, FR 0853661.

French Preliminary Search Report dated Apr. 8, 2009, FR 0854580.

Faure, R. et al., "Précis de Recherche Opérationnelle: Méthodes et Exercices," ("Handbook for Operations Research: Lessons and Practice Exercises,"), 5th Edition, Sciences Sup., Dunod, Jan. 2004, pp. 60-93.

Office Action in U.S. Appl. No. 11/795,511, dated Jul. 23, 2010.

Office Action in U.S. Appl. No. 11/795,511, Jan. 20, 2011.

Office Action in U.S. Appl. No. 11/795,511, mailed Aug. 16, 2011.

Chan, S. C. et al. "Practical Considerations in RLCK Crosstalk Analysis for Digital Integrated Circuits," Proc. of the IEEE/ACM International Conference on Computer-Aided Design, 2001, 7 pages.

* cited by examiner

FILTERING OF SMALL VALUES FOR THE VERIFICATION OF INTEGRATED CIRCUITS

CROSS REFERENCE TO RELATED APPLICATIONS OR PRIORITY CLAIM

This application claims priority of French Patent Application No. 08 53661, filed Jun. 3, 2008.

TECHNICAL FIELD AND PRIOR ART

The invention relates to the field of integrated circuits and methods and devices enabling the design thereof.

Following the design of an integrated circuit it is aimed to estimate its electrical behaviour before its production.

This electrical behaviour is typically modelled by models for the different types of components.

A distinction is made between:
on the one hand, the designed and requisite components,
on the other hand, the non designed components, but which are necessary to model the physical behaviour of the integrated circuit.

In particular, in technologies known as "sub-100 nm", the interconnections, the packages or the substrate have an important influence on the behaviour of the integrated circuit.

For example, ideally, the clock of the circuit must arrive everywhere at the same time. Unfortunately this is not the case, because each transistor introduces a slight delay. In addition, the interconnections introduce an additional delay. Above "sub-100 nm", the additional delay of the interconnections is negligible. Below, it is noted that the delay of the signals by the interconnections is higher than that introduced by the active components. These effects due to the interconnections and to the transistors thus have to be modelled, when checking the circuit, without these components forming part of the design of the electric circuit.

These components are known as "parasitic", because they degrade the correct operation of the integrated circuit. Their particularity is that the current-voltage relation therein is linear. Typically resistive, capacitive and inductive components are used to model electromagnetic effects due to current transfers in the non designed components and the different behaviours of these components. One behaviour consists in delaying signals; another behaviour achieves the opposite, and the signal may then be accelerated due to the parasites. Yet another behaviour is the coupling of signals of one network to another via an electric or magnetic interface.

Figure 1:
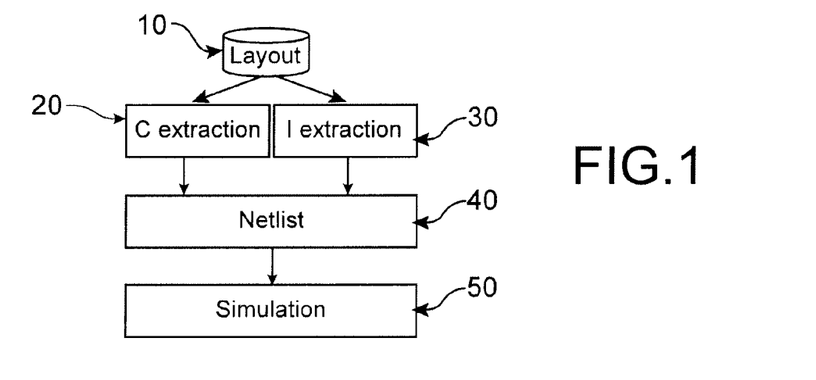
FIG. 1 illustrates the steps of a method according to the prior art.

A method of simulating an integrated circuit is known, the steps of which are briefly recalled in FIG. 1.

Firstly, a description of the masks plane, indicated layout 10, is used to represent the implementation of an integrated circuit. From this layout and technological information at least two softwares 20 and 30 are used to recognise the electrical representation of the integrated circuit:

a first extraction software 20, indicated "C extraction", which recognises the part designed by the designer,
and a second extraction software 30, indicated "I extraction", is a software which recognises the interconnections and which models them with linear components.

The aforementioned technological information concerns the layers of masks and their specificities: for each layer—and there can be a good hundred or so—there is at least the information such as the name, the number, the colour for the display, the conductivity, the permeability, the susceptibility, . . . etc.

The result of the two extractions consists in a list of electrical components and their interconnections, indicated netlist 40. This netlist is normally used to execute simulations and analyses by using a simulator 50. However the capacity of the simulators is exceeded by the mass of information to be processed (the number of linear components is exorbitant), and the analyses carried out at this stage are thus costly. Means exist for reducing the number of components by model order reduction approaches. A system dedicated to such a reduction is disclosed in document WO2007051838.

The extractors as well as the reduction system disclosed in this document have a common problem. In particular, an important step in the delivery of the netlist is the filtering of small values. In the presently known technique, the components known as "parasitic" are filtered during the execution of the software 30 ("I" extraction). Normal filtering consists in defining a minimum threshold value for the different types of components. Thus there is a minimal resistance for the resistors, as well as a minimal capacitive value for the capacitors.

Figure 2A:
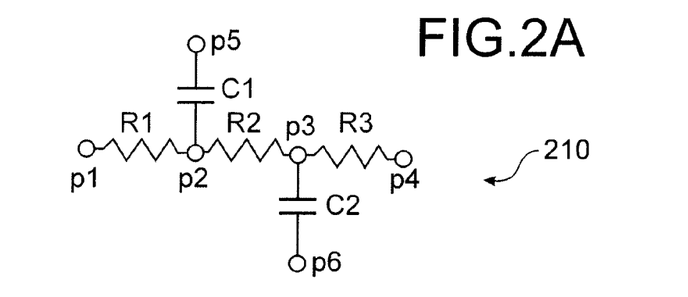
FIGS. 2A-2B respectively represent a part of an integrated circuit and the system obtained from this portion of integrated circuit after a filtering according to the prior art.
Figure 2B:
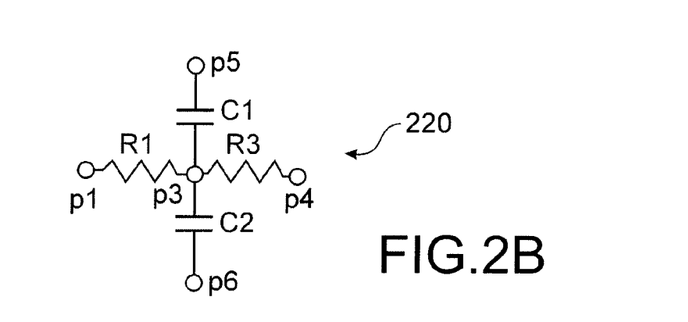

An example of this filtering is illustrated in FIGS. 2A and 2B.

Reference 210 designates a part of an integrated circuit. Before filtering, this part comprises resistors R1-R4 and capacitances C1-C2. p1-p6 indicate the crossover or intersection points with other parts of the circuit.

The filtering consists in determining a Rmin threshold and comparing all of the resistors R1-R4 with Rmin.

Let us assume that, in the circuit 210, only R2 is smaller than Rmin. In this case, R2 will be filtered, in other words R2 will be eliminated and its connections p2 and p3 are grouped together in a single connection. The result of this simple filtering approach is illustrated in FIG. 2B, it is the circuit 220.

This approach, despite its simplicity, is no longer sufficiently efficient, because the threshold of minimal values is difficult to determine and no control on the precision of the operation may be applied.

The problem is therefore posed of finding a novel filtering method, enabling these drawbacks to be overcome.

The problem is also posed of finding a novel method making it possible to improve the precision of integrated circuit simulations.

DESCRIPTION OF THE INVENTION

To resolve this problem, the present invention proposes a technique for improving the precision of integrated circuit simulations by the application of a novel filtering method and a novel method for preparing data.

More specifically, the invention firstly relates to a method of simulating an electronic circuit, represented in the form of masks and connections, comprising:

a) the definition of the circuit in the form of a first list of electrical components and their interconnections, b) the separation of the data of this first list into a first sub-assembly of components to be modified by a filtering step, and into a second sub-assembly of components not to be modified by this filtering step, c) the filtering of the data of the first sub-assembly of components, d) the definition of the circuit in the form of a second list of electrical components and their interconnections, from the data of the second sub-assembly and the data resulting from step c), e) the simulation of the circuit by means of this second list.

If the result of the simulation is satisfactory, the circuit may be manufactured.

According to the invention, the data are prepared by separating the data not to be modified by filtering the data to be filtered. The data are then transformed, filtered, retransformed and restored to the place where they have been taken to form the second list.

The data of this second list may then be analysed using a simulator.

The invention thus implements an additional step to the known steps implemented in known extraction and reduction systems.

An additional step of reduction of the data of the first or the second list may moreover be implemented.

According to one embodiment, step c) of filtering comprises a step of filtering the values of a symmetric matrix conserving its positive defined character.

Step c) of filtering small values may be carried out by implementing a Jacobi rotation.

The invention thus also relates to a method for filtering small values for checking integrated circuits, comprising, from a description of integrated circuit to be manufactured:

a) a step of recognition of the components to re-establish the electrical description of the integrated circuit, for example by use of extraction softwares, b) a step of separating the data to determine the content of the parasites, c) a step of transforming the network description into a positive defined symmetric matrix representation, d) a step of filtering small values, for example a filtering of small values is carried out using a Jacobi rotation, e) a step of transforming the matrix description into network description.

A new description of the integrated circuit may then be obtained.

The data to be processed and the data not to be processed may be separated either automatically or manually (example of manual separation: it is possible to employ a text editor and cut one of the two parts of a file and recopy this part in a blank file).

The invention also relates to a device for simulating an electronic circuit, represented in the form of masks and connections, comprising:

a) means for receiving the definition of the circuit in the form of a first list of electrical components and their interconnections, b) means for separating the data of this first list into a first sub-assembly of components to be modified by a filtering step, and into a second sub-assembly of components not to be modified by this filtering step, c) means for filtering the data of the first sub-assembly of components, d) means for defining the circuit in the form of a second list of electrical components and their interconnections, from the data of the second sub-assembly and the data resulting from step c), e) means for simulating the circuit by means of this second list.

The invention also relates to a data support that may be read by computer, comprising the instructions to implement a method according to the invention.

The filtering step, or the means for filtering data, may comprise or may implement the following sub-steps:

A) one defines two error parameters:

$e_{absolute}$, and $e_{relative}$

B) one calculates, for any element $C_{pq}$ of the matrix C such that $C_{pq} < e_{absolute}$:

$$C' = \Omega^T_{pq} C \Omega_{pq}$$

Where $\Omega_{pq}$ is a matrix of rotation on the indices (p, q):

$$\Omega_{pq} = \begin{bmatrix} 1 & 0 & 0 & 0 & 0 \\ 0 & c & 0 & s & 0 \\ 0 & 0 & 1 & 0 & 0 \\ 0 & -s & 0 & c & 0 \\ 0 & 0 & 0 & 0 & 1 \end{bmatrix} \begin{matrix} \\ \to p \\ \\ \to q \\ \end{matrix}$$

where:

$c = \cos \Theta$ and $s = \sin \Theta$, the value of the angle $\Theta$ being chosen so as to have:

$C'_{pq} = C'_{qp} = 0$

C) If, for all of the non-diagonal elements (thus $i \neq j$) of C' and C one has:

$|C'_{ij} - C_{ij}| < e_{absolute}$

Or if:

$|C'_{ij} - C_{ij}| < e_{relative}|C_{ij\_1}|$ then C is replaced by C',

D) If not, the matrix C remains unchanged. According to one specific embodiment, if C is replaced by C' at the end of step C, then one can have:

E) If $C'_{ij} = 0$ and $C'_{ij} \neq 0$ then the following transformation is carried out:

$C_{ij} = 0$, $C_{ii} = C'_{ii} + |C'_{ii}|$, $C_{jj} = C'_{jj} + |C'_{jj}|$;

If not: $C_{ij} = C'_{ij}$

DETAILED DESCRIPTION OF SPECIFIC EMBODIMENTS

As indicated previously, the present invention is a system for improving the precision of integrated circuit simulations after the creation of an integrated circuit, by addition of a step of filtering small values using a novel method.

Figure 3:
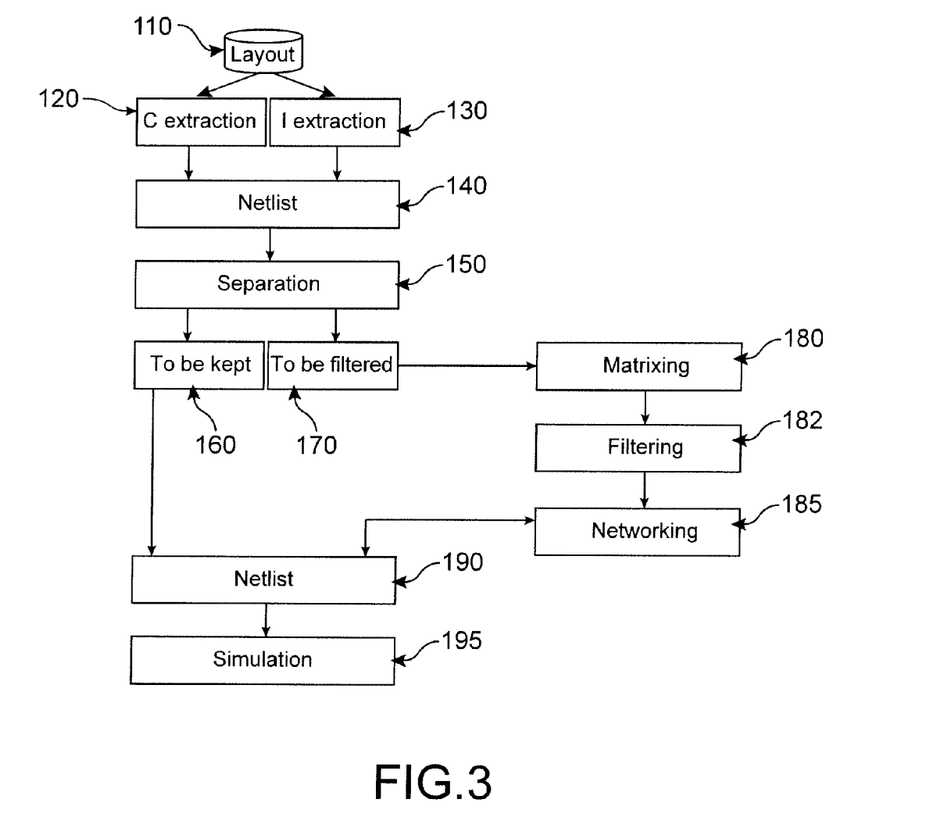
FIG. 3 illustrates the steps of a method according to the invention.

FIG. 3 represents the steps of a method for filtering small values according to the present invention.

This method begins from the lithographic masks plane 110, or the computerised description of these masks. This plane is the outline of the layers of the different components (geometry) and their connections.

These masks are organised in layers, which may be numerous, for example at least 100 layers or more, and each of these layers contains the geometric forms that are going to serve as negative during the manufacture of the circuit.

Each layer also contains the profiles or technological information, in other words the technical characteristics of materials such as the impedance as a function of the distance between the components, the relative permittivity, the permeability of the materials and the temperature, or the diffusion characteristics, doping profiles, etc. For example, each material has its resistivity by segment. A segment has a limited section and length.

The collection of segments for all of the components or geometric elements defines the resistive network.

This description of the masks plane is again called "layout" 110. This description is supplied to one or two types of extraction software. In the case of two softwares, as in FIG. 3, a first software 120, indicated "C" extraction, makes it possible to extract the designed electrical circuit. The electrical circuit may contain all the possible components of an integrated electrical circuit. In particular, it may contain transistors (M), and/or diodes (D), and/or resistors (R), and/or capacitors (C) and/or inductions (L). The circuit is available at the output of the software 120 in the form of "netlist" in SPICE electric format or in a database, for example an owner database of the supplier of the software 120.

A second software 130, indicated "I" extraction, makes it possible to extract the interconnections of the mask plane, by means of technological information such as that mentioned above, which is associated with the layout 110. At the output of this second software are also files in SPICE electric format, but also in DSPF (Delay Standard Parasitic Format), or SPEF (Standard Parasitic Exchange Format) or in databases, for example owner bases of the supplier of the software 130. The files or databases contain electrical components, but uniquely resistors (R), and/or capacitors (C) and/or inductions (L). The typical values of these components are around:

several milli-Ohm to several Ohm for resistors (R), for example between 0.5 Ohm and 10 Ohm;
several pico-Farad (pF) for capacitors (C), for example between 1 pF and 10 pF;
several pico-Henry (pH) for inductions (L), for example between 1 pH and 10 pH;
Examples of these softwares are:
For the software 120, the software "Assura" of Cadence Design Systems, or "Calibre" of Mentor Graphics or "Star" of Synopsys.
For the software 130, extensions may be used for the interconnections of the softwares cited above, thus in particular the software "Assura RCX" of Cadence Design Systems, or "Calibre XRC" of Mentor Graphics or "Star RCXT" of Synopsys.

The result of these two extractions consists in a list of electrical components and their interconnections, indicated netlist 140.

In other words, this netlist is an electrical description of the integrated circuit which comprises a list of components recognised during step 120 or 130 and the connections between these components. It will be noted that the two types of extraction results will be mixed. In methods for designing large integrated circuits, particularly SOC (System on Chip), several blocks exist on a same chip, which are processed independently with the softwares 120 and 130. Quite often, blocks of another supplier are used and this thus supplies the parts of two netlists.

It will also be noted that it does not necessary involve all types of components (resistors, capacitors, inductions, etc.). Indeed, the softwares 130 preferably have a function making it possible to be selective, thus to choose the extraction mode, for example "R", and/or "C", and/or "RC", and/or "RCL", which makes it possible to select the components thereby retained (uniquely resistors, or uniquely capacitors, or uniquely inductions, etc. or mixture of two or several of these categories).

This description may be memorised in a database or an electronic file. At the end of steps 120 and 130, the user ends up with a mixed data system, with components from "C" extractions and other components from "I" extractions, as described previously. The next step in the sequence of softwares is normally the use of an electric simulator 50. This is for example a SPICE type time simulator, such as HSPICE of Synopsys, or Spectre of "Cadence Design Systems" or Eldo of "Mentor Graphics".

Despite the data reduction efforts employed in "C" extraction as for example proposed by WO2007/051838 or in the article of P. Vanoostende et al. entitled "DARSI: RC-Data reduction" (IEEE Transactions on Computer-Aided Design of IC circuits and Systems", vol. 10, April, N° 4, NY, 1991), the mixed data are not always optimised for the simulators. Different methods have been applied for the reduction but, almost always, small values subsist. These small values cannot be filtered simply by application of a minimal threshold, because they have been kept by the reduction system so that the whole of the piece of the electrical circuit remains passive, stable and coherent. With the invention one ends up with a more overall step, which has a complete view over the subassemblies of different extractions. It is thus possible to filter small values with a method described in the present application, which makes it possible to guarantee the passivity and the stability, thus the integrity of the circuit, which is not the case with simple filterings.

The invention comprises a data separation step 150. This step is implemented from information relative to the integrated circuit and it makes it possible to define the parts to be filtered in a more controlled manner than if the filtering was carried out immediately after the extraction steps 120, 130 but before generation of the netlist 140. During the separation of data one determines on the one hand the data not to be altered, on the other hand the data that are ready to be altered, thus filtered. The separation is concentrated on linear elements, such as resistors, capacitors and inductions. It should be noted that certain elements can be created by the "I" extractors, while others may be generated by the "C" extractors. These linear elements all have the same type of declaration in the database or in the "netlist" files: firstly the unique name, then the name of the model, then the two connections with the neighbourhood, then the value.

The automatic separation is executed from recognition rules, which are highly variable. In most cases, it is sufficient to declare that the elements that have a certain name or a certain fraction of name are to be provided for the filtering. Sometimes, the distinction may be made on the type of model used, or simply with limits of minimal and maximal values.

The result of this separation step 150 comprises two subassemblies of data:
a first sub-assembly 160 of data, indicated data "to be kept";
a second sub-assembly 170 of data, indicated data "to be filtered".
Each of these sub-assemblies may be assumed to be non-empty.

The first sub-assembly 160 thus contains the data to be kept. All of the non-linear components, such as transistors and diodes, are automatically found in this sub-assembly. The voltage and current sources are also found therein. Depending on the separation rules, linear components thus exist, for which an alteration is not desired. For example, the designed components could be chosen here. Another example could be a signal row, which must in no case be changed for point by point investigation reasons.

The data to be filtered 170 appears for example as data containing uniquely elements such as resistors and capacitances. These components are combined in several ways (for example: resistors in series and in parallel, coupling capacitors within a same network, coupling capacitors between two separate networks, etc.) to create an electrical network.

The data 170 to be filtered are then successively:
- matrixed (step 180) to arrive at a mathematical representation; during this step, two matrices, one, G, or matrix of resistors and the other, C, or matrix of capacitors (remember that the components of the netlists 140 are stored in "lists", not in matrices);
- filtered (step 182),
- networked (step 185); this is the retransformation of the matrices into electrical network.

The data 160 (which have been kept and not filtered) and the data generated by step 185 are mixed or combined to establish a new netlist 190.

The manner in which this "mixing" or this recombination is carried out, depends on the manner in which the data has been separated. In the case where one has separate input files, the output files are simply concatenated. In the case where it has been necessary to find the parts to be filtered, the place, or the places, in the file 140, where the components have to be restored has been memorised.

This netlist is supplied to a simulation software for a simulation step 195. At present several softwares are available to execute this simulation step 195, for example one of the following softwares may be used: "Spectre" or "UltraSim" of Cadence Design Systems, "Eldo" of Mentor Graphics or "HSIM", or "Primetime" of Synopsys.

Document WO2007/051838 discloses a method that makes it possible to considerably reduce the size of the files of the netlists. This is an approach that reduces the components R, L, C, K.

Figure 4A:
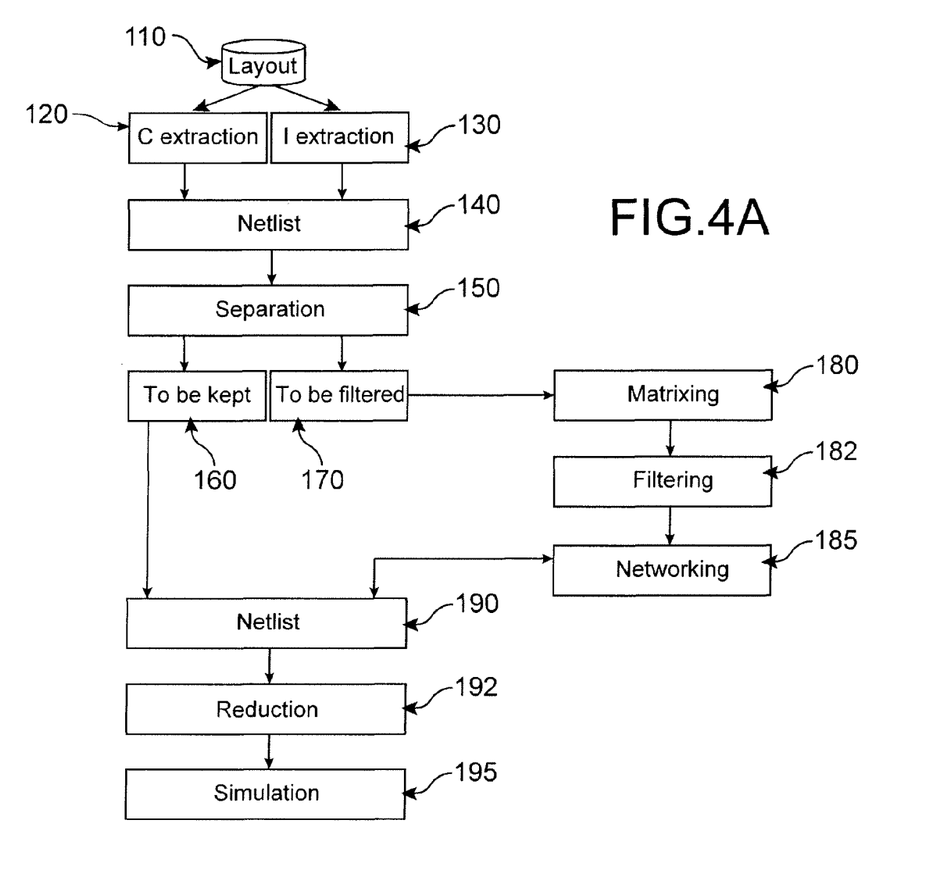
FIGS. 4A and 4B illustrate alternatives of a method according to the invention.

This method of document WO2007/051838 may be implemented from the result of step 190. In this case, as illustrated in FIG. 4A, instead of going directly from this latter step 190 to the simulation step 195, the data reduction method (step 192) is implemented as disclosed in the aforementioned document (or another data reduction).

Figure 4B:
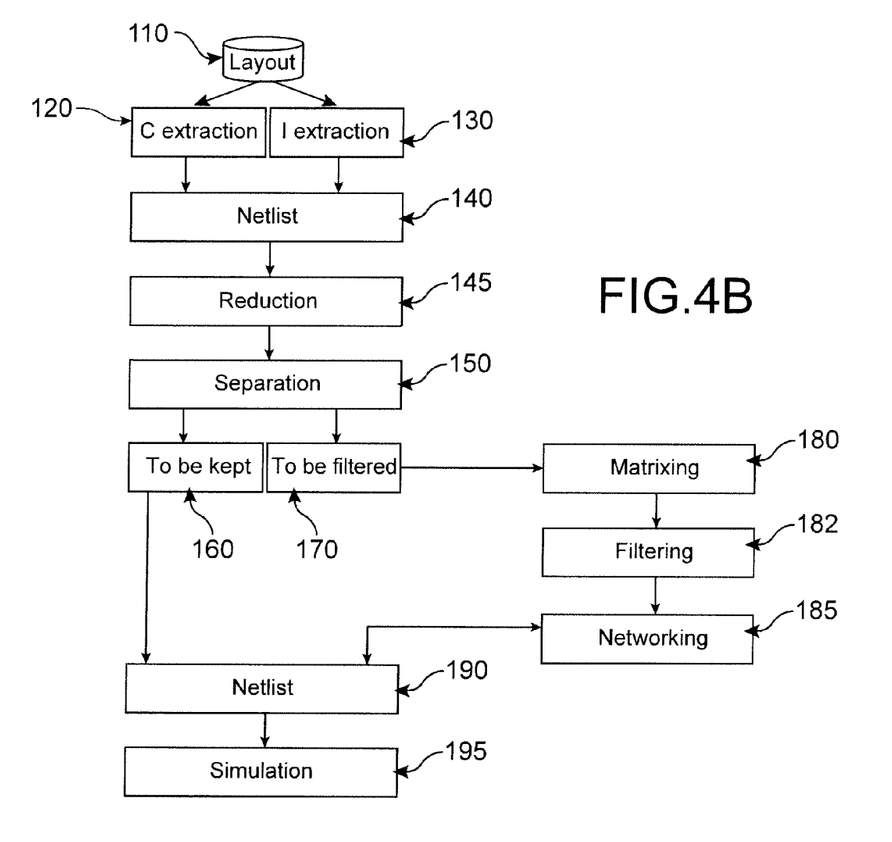

According to an alternative, illustrated in FIG. 4B, it is possible to implement the method according to the present invention after having used the data reduction method (step 145) disclosed in document WO2007/051838 (or another data reduction) then carried out the separation operations to define on the one hand the data to be kept and on the other hand those to be filtered.

An electrical network RC is expressed by a matrix of conductances G and a matrix of capacitors C that reflect the Kirchoff laws of the network. The execution times of an electrical circuit simulation software will be dependent on the dimension as well as the number of non-zero elements of these matrices.

An order reduction method, such as disclosed in document WO2007/051838, or such as used within the simulation software cited above, also uses a system with real (G) and imaginary (C) matrices. This kind of system makes it possible to reduce the dimension of matrices G and C while conserving their positive defined character. However, it often happens that the reduction method increases the density of the matrices by increasing the number of non-zero elements, which reduces its interest for the simulation, because it is possible to end up with more components than before the reduction.

Frequently, the reduced matrices contain a large number of small non-zero values. It is aimed to eliminate these small values by considering that they have a low impact on the simulation.

This is possible if the reduced matrix is diagonally dominant, which is often the case of matrices following a reduction of resistors uniquely. This is not easily possible if the matrices are not diagonally dominant, which is often the case for matrices that come out of an electrical network reduction with components R, C and L (as disclosed in WO2007/051838). Indeed, the simple elimination of small values, thus without the system according to the present invention, risks losing the positivity of a matrix that is not diagonally dominant and can then bring about the instability of the following simulation.

This makes it possible to understand the interest of placing the filtering system after the reduction system.

According to the invention, it is possible to implement a method of filtering small values of a symmetric matrix while conserving its positive defined character and thereby guaranteeing the stability.

To explain such a filtering method, one begins with the Jacobi diagonalization method. This method is, generally speaking, explained in the article of Rutishauser "The Jacobi Method for Real Symmetric Matrices", Numerical Mathematics 9 (1966), 1-10.

According to this method, a series of transformations is applied that makes it possible to eliminate successively the elements of the matrix that are situated outside of its diagonal.

Let us assume that the matrix is constituted of a series of elements $(C_{pq})$, p=1, ... N, q=1, ..., M.

Each transformation is a rotation on the 2 indices (p, q) enabling the element $C_{pq}$ to be zeroed. This transformation conserves the eigenvalues. At the end of the Jacobi algorithm, a diagonal matrix containing the eigenvalues of the matrix is obtained.

In the method according to the invention, the following congruence is carried out:

$$C' = \Omega_{pq}^T C \Omega_{pq}$$

Where $\Omega_{pq}$ is a matrix of rotation on the indices (p, q):

$$\Omega_{pq} = \begin{bmatrix} 1 & 0 & 0 & 0 & 0 \\ 0 & c & 0 & s & 0 \\ 0 & 0 & 1 & 0 & 0 \\ 0 & -s & 0 & c & 0 \\ 0 & 0 & 0 & 0 & 1 \end{bmatrix} \begin{matrix} \\ \rightarrow p \\ \\ \rightarrow q \\ \end{matrix}$$

where:
c=cos Θ and s=sin Θ
The value of the angle Θ is chosen so as to have:

$$C'_{pq} = C'_{qp} = 0$$

In the filtering method according to the invention, the non-diagonal elements $C_{pq}$ of the matrix are examined, the absolute value of which is less than an absolute error $e_{absolute}$. The typical value for a capacitive filtering is $e_{absolute} = 10^{-18}$ F. A relative error $e_{relative}$ is also defined.

According to this method, all of the elements $C_{pq}$ of the matrix are successively examined by verifying if $$|C_{pq}| < e_{absolute}.$$

If this criterion is satisfied, one calculates the matrix:

$$C' = \Omega_{pq}^T C \Omega_{pq}$$

If, for all of the non-diagonal elements (thus i≠j) of C' and C one has:

$$|C'_{ij}-C_{ij}|<e_{absolute}$$

Or if:

$$|C'_{ij}-C_{ij}|<e_{relative}|C_{ij}|$$

then the Jacobi rotation is accepted and C is replaced by C'. If not, the Jacobi rotation is refused and the matrix C remains unchanged.

The method is thus controlled by an absolute error and a relative error linked to the degree of precision that it is wished to keep.

Typically $e_{relative}=5\%$.

The Jacobi transformation only modifies the rows and columns p and q of the matrix but it can transform a zero element of the matrix into non-zero element. In order not to introduce new non-zero elements into the matrix, the Jacobi elementary rotation is modified as follows:

If the Jacobi rotation is accepted, one examines the elements $C'_{ij}$.

If $C'_{ij}=0$ and $C'_{ji}\neq 0$ then the following transformation is carried out:

$$C_{ij}=0,\ C_{ii}=C'_{ii}+|C'_{ii}|,\ C_{jj}=C'_{jj}+|C'_{jj}|;$$

If not: $C_{ij}=C'_{ij}$

This modification of the Jacobi transformation always guarantees the positivity of the matrix after transformation. The eigenvalues will be faintly altered if $e_{absolute}$ is small (the error on the eigenvalues is around $e_{absolute}$).

Figure 5A:
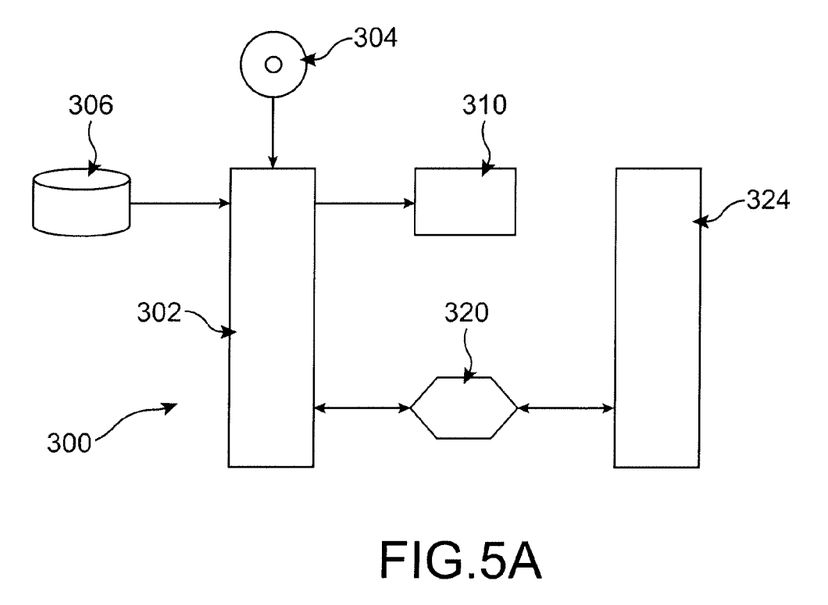
FIGS. 5A and 5B schematically represent a device for implementing a method according to the invention.

FIG. 5A represents a computer system 300 that can be used to implement the present invention. A computer 302 receives a programme instruction set on a medium 304 that can be read by the computer, such as a CD-ROM, DVD, tape or a direct link with another computer. The computer executes the instructions to read all or part of a description of a masks plane from a database 306 or any other storage medium. The computer executes successively the steps of data separation, transformation, filtering, to arrive at another representation of the integrated circuit for the simulation.

The computer 302 may be an isolated computer or connected to a network. In addition, it may be connected to other computers 324 through communication means 320 such as the Internet.

The computer or the micro-computer 302 is configured in a suitable manner for the processing of information relative to a circuit according to a method complying with the invention. It comprises a calculation section with all of the electronic components, softwares or other, necessary for the implementation of a method according to the invention, for example such as that of FIG. 3.

Thus, for example (FIG. 5B), it comprises a programmable processor 326, a memory 328 and an input device, for example a hard disk 332, coupled to a bus system 330. The processor may be, for example, a microprocessor, or a central unit processor. The memory 328 may be, for example, a hard disk, an ROM dead memory, a compact optical disk, a DRAM dynamic random access memory or any other type of RAM memory, a magnetic or optic storage element, registers or other volatile and/or non volatile memories. Processing algorithms according to the invention, calculations from circuit data, comprising instructions which may be stored in the memory, and which make it possible to carry out operations of filtering and/or simulations as described above on circuit data, in accordance with any of the embodiments of the present invention.

Figure 5B:
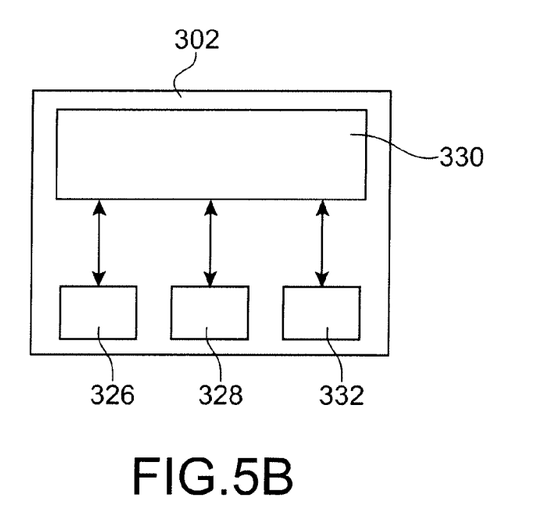

A programme, making it possible to implement a method according to the invention, is resident or saved on a support (for example: floppy disk or a CD ROM or a DVD ROM or a removable hard disk or a magnetic support) capable of being read by an information system or by the microcomputer 302.

The micro-computer 302 may also be connected to other peripheral devices, such as for example, printing devices. It may be connected to an Internet type electronic network, enabling data relative to the simulation results to be sent.

It is possible to display on a screen an image representative of a simulation result, and also an image of a mask plane. Once the circuit has been satisfactorily tested by the designer, it can be manufactured and physically tested.

Circuit manufacturing means, such as those known in the semi-conductors and integrated circuits industry, may then be implemented, from the moment that the simulation result obtained with a device for simulating an electronic circuit according to the invention is satisfactory.

A method and a device according to the invention thus play an important role in the manufacture of an integrated circuit, because they enable a considerable time saving in the elaboration and the manufacture of such a circuit.

The invention claimed is:

1. Method for simulating an electronic circuit, represented in the form of masks and connections, comprising:
   a) the definition of the circuit in the form of a first list of electrical components and their inter-connections,
   b) the separation of the data from this first list into a first sub-assembly of components to be modified by a filtering step, and into a second sub-assembly of components not to be modified by said filtering step,
   c) the filtering of the data from the first sub-assembly of components,
   d) the definition of the circuit in the form of a second list of electrical components and their inter-connections, from the data from the second sub-assembly and from the data resulting from step c),
   e) the simulation of the circuit by means of said second list by using a computer, and
   f) in case of satisfactory result of the simulation, the production of the circuit,
   wherein the filtering step c) comprises a step of filtering the values from a symmetric matrix preserving its positive definiteness, and
   wherein:
   1) two error parameters are defined:
   $e_{absolute}$ and $e_{relative}$
   2) for any element $C_{pq}$ of the matrix C such that $C_{pq<eabsolute}$, C' is determined as:

$$C'=\Omega^t_{pq}C\Omega_{pq}$$

where $\Omega pq$ is a rotation matrix on the indices (p, q):

$$\Omega_{pq}=\begin{bmatrix}1 & 0 & 0 & 0 & 0\\ 0 & c & 0 & s & 0\\ 0 & 0 & 1 & 0 & 0\\ 0 & -s & 0 & c & 0\\ 0 & 0 & 0 & 0 & 1\end{bmatrix}\begin{matrix}\\ \to p\\ \\ \to q\\ \end{matrix}$$

where:
$c=\cos\Theta$ and $s=\sin\Theta$, the value of the angle $\Theta$ being chosen so as to have:

$$C'pq=C'qp=0$$

3) if, for all of the non-diagonal elements (thus i≠j) of C' and C:

$|C'_{ij}-C_{ij}|<e_{absolute}$

Or if:

$|C'_{ij}-C_{ij}|<e_{relative}|C_{ij}|$ then C is replaced by C', 4) if not, the matrix C remains unchanged.

2. Method according to claim 1, further comprising, between step d) and step e), a step of reducing the data from the second list.

3. Method according to claim 1, further comprising, between step a) and step b), a step of reducing the data from the first list.

4. Method according to claim 1, the first sub-assembly of components containing resistors and capacitances.

5. Method according to claim 1, wherein, if C is replaced by C' at the end of step C, then:
   if $C'_{ij}=C_{ii}$ and $C'_{ij}\neq 0$ then the following transformation is carried out:

$C_{ij}=0, C_{ii}=C'_{ii}+|C_{ii}|, C_{jj}=C'_{jj}+|C'_{jj}|;$

If not, $C_{ij}-C'_{ij}$.

6. Device for simulating an electronic circuit, represented in the form of masks and connections, comprising:
   a processor configured to:
   a) receive a definition of the circuit in the form of a first list of electrical components and their inter-connections,
   b) separate data from said first list into a first sub-assembly of components to be modified by a filtering step, and into a second sub-assembly (160) of components not to be modified by said filtering step,
   c) filter data from the first sub-assembly of components,
   d) define the circuit in the form of a second list of electrical components and their inter-connections, from the data from the second sub-assembly and from the data resulting from step c),
   e) simulate the circuit by means of said second list,
   wherein the filtering in c) comprises filtering the values from a symmetric matrix preserving its positive definiteness, and
   wherein:
   1) two error parameters are defined:
      $e_{absolute}$ and $e_{relative}$
   2) for any element $C_{pq}$ of the matrix C such that $C_{pq}<e_{absolute}$, C' is determined as:

$C'=\Omega^t_{pq}C\Omega_{pq}$ where $\Omega pq$ is a rotation matrix on the indices (p, q):

$$\Omega_{pq} = \begin{bmatrix} 1 & 0 & 0 & 0 & 0 \\ 0 & c & 0 & s & 0 \\ 0 & 0 & 1 & 0 & 0 \\ 0 & -s & 0 & c & 0 \\ 0 & 0 & 0 & 0 & 1 \end{bmatrix} \begin{matrix} \\ \rightarrow p \\ \\ \rightarrow q \\ \end{matrix}$$

where:
c =cos Θ and s=sin Θ, the value of the angle Θ being chosen so as to have:

C'pq=C'qp=0

3) if, for all of the non-diagonal elements (thus i≠j) of C' and C:

$|C'_{ij}-C_{ij}|<e_{absolute}$

Or if:

$|C'_{ij}-C_{ij}|<e_{relative}|C_{ij}|$ then C is replaced by C', 4) if not, the matrix C remains unchanged.

7. Device according to claim 6, wherein the processor is further configured for carrying out a reduction of the data from the first or from the second list.

8. Method according to claim 2, the first sub-assembly of components containing resistors and capacitances.

9. Method according to claim 3, the first sub-assembly of components containing resistors and capacitances.

10. The device of claim 6, wherein the processor is further configured to, between d) and e), reduce the data from the second list.

11. The device of claim 6, wherein the processor is further configured to, between a) and b), reduce the data from the first list.

12. The device of claim 6, wherein the first sub-assembly of components contains resistors and capacitances.

13. The device of claim 10, wherein the first sub-assembly of components contains resistors and capacitances.

14. The device of claim 11, wherein the first sub-assembly of components contains resistors and capacitances.

15. The device of claim 6, wherein, if C is replaced by C' at the end of step C, then:
   if $C'_{ij}=C_{ii}$ and $C'_{ij}\neq 0$ then the following transformation is carried out:

$C_{ij}=0, C_{ii}=C'_{ii}+|C_{ii}|, C_{jj}=C'_{jj}+|C'_{jj}|;$

If not, $C_{ij}-C'_{ij}$.

* * * * *